(12) United States Patent
Lin

(10) Patent No.: US 10,848,103 B1
(45) Date of Patent: Nov. 24, 2020

(54) LOW-NOISE LOW-EMISSION CRYSTAL OSCILLATOR AND METHOD THEREOF

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 16/794,338

(22) Filed: Feb. 19, 2020

(51) Int. Cl.
*H03B 5/36* (2006.01)
*H03B 5/06* (2006.01)
*H03B 5/12* (2006.01)

(52) U.S. Cl.
CPC .............. *H03B 5/364* (2013.01); *H03B 5/06* (2013.01); *H03B 5/1228* (2013.01); *H03B 5/368* (2013.01)

(58) Field of Classification Search
CPC .......... H03B 5/364; H03B 5/368; H03B 5/06; H03B 5/1228

USPC ........................ 331/158, 116 FE, 116 R, 175
See application file for complete search history.

(56) References Cited

U.S. PATENT DOCUMENTS

| | | | | |
|---|---|---|---|---|
| 6,097,257 A | * | 8/2000 | Kadowaki | G04F 5/06 331/116 FE |
| 6,320,473 B1 | * | 11/2001 | Leuschner | H03B 5/06 331/116 FE |
| 10,291,180 B2 | * | 5/2019 | Lin | H03B 5/364 |

\* cited by examiner

*Primary Examiner* — Arnold M Kinkead
(74) *Attorney, Agent, or Firm* — McClure, Qualey & Rodack, LLP

(57) ABSTRACT

A crystal oscillator includes an inverter configured to receive a first voltage at a first node and output a second voltage at a second node, a stacked-diode feedback network inserted between the first node and the second node, a waveform shaper configured to couple the second node to a third node in accordance with the first voltage, a crystal inserted between a fourth node and a fifth node, wherein the fourth node is coupled to the third node, and the fifth node is coupled to the first node, a first shunt capacitor inserted between the fourth node and a ground node, and a second shunt capacitor inserted between the fifth node to and the ground node.

12 Claims, 4 Drawing Sheets

US 10,848,103 B1

LOW-NOISE LOW-EMISSION CRYSTAL OSCILLATOR AND METHOD THEREOF

BACKGROUND OF THE DISCLOSURE

Field of the Disclosure

The present disclosure generally relates to crystal oscillators, and more particular to crystal oscillators having low noise and low emissions.

Description of Related Art

As shown in FIG. 1, a crystal oscillator 100 comprises: an inverter 110 configured to receive a voltage $V_A$ at node 101 and output a voltage $V_A$ at node 102; a self-biasing feedback resistor 130 inserted between node 102 and node 101; a first optional resistor 170 inserted between node 102 and node 103; a second optional resistor 160 inserted between node 104 and node 101; and a resonant tank 180 comprising a crystal 120 inserted between node 103 and node 104, a first shunt capacitor 150 configured to shunt a voltage $V_C$ at node 103 to ground, and a second shunt capacitor 140 configured to shunt a voltage $V_D$ to ground. When the first optional resistor 170 is not used, it is replaced by a short circuit. Likewise, when the second optional resistor 160 is not used, it is replaced by a short circuit. In an embodiment, inverter 110, self-biasing feedback resistor 130, the first optional resistor 170, and the second optional resistor 160 are integrated as an integrated circuit fabricated on a semiconductor substrate and packaged using a semiconductor package, while the resonant tank 180 is an external network. Crystal oscillator 100 is widely used in the prior art and thus not described in detail here.

One issue manifested in a conventional crystal oscillator 100 is the self-biasing feedback resistor 130 is usually a significant noise contributor and can adversely degrade a performance. Without the self-biasing feedback resistor 130, however, crystal oscillator 100 might fail to oscillate. Another issue is manifested in a waveform of voltage $V_C$ that is close to a square wave that contain rich harmonics, and it usually leads to undesired high-frequency emissions. In U.S. Pat. No. 10,291,180 to Lin, Lin teaches a crystal oscillator that can alleviate the noise of the self-biasing feedback resistor 130 but does not address the emission issue.

What is desired is a crystal oscillator that has low noise and low emissions.

BRIEF SUMMARY OF THIS DISCLOSURE

In an embodiment, a crystal oscillator comprises: an inverter configured to receive a first voltage at a first node and output a second voltage at a second node; a feedback network inserted between the first node and the second node, the feedback network comprising a parallel connection of a first branch and a second branch, the first branch comprising a first diode and a second diode stacked up in a forward direction, the second branch comprising a third diode and a fourth diode stacked up in a reverse direction; a waveform shaper configured to couple the second node to a third node, the waveform shaper comprising a parallel connection of a coupling resistor, an NMOS transistor, and a PMOS transistor; a crystal inserted between a fourth node and a fifth node, wherein the fourth node is coupled to the third node, and the fifth node is coupled to the first node; a first shunt capacitor inserted between the fourth node and a ground node; and a second shunt capacitor inserted between the fifth node to and the ground node.

In an embodiment, a method comprises: incorporating an inverter to amplify a first voltage at a first node into a second voltage at a second node; inserting a waveform shaper between the second node and a third node, wherein the waveform shaper comprises a parallel connection of a resistor, an NMOS (n-channel metal oxide semiconductor) transistor, and a PMOS (p-channel metal oxide semiconductor) transistor; inserting a crystal between a fourth node and a fifth node, wherein the fourth node is coupled to the third node, and the fifth node is coupled to the first node; inserting a first shunt capacitor between the fourth node and a ground node; inserting a second shunt capacitor between the fifth node and the ground node; and inserting a feedback network between the second node and the first node, wherein the feedback network comprises a parallel connection of a first branch and a second branch, the first branch comprising a first diode and a second diode stacked in a forward direction, the second branch comprising a third diode and fourth diode stacked in a reverse direction.

DETAILED DESCRIPTION OF THIS DISCLOSURE

The present disclosure is directed to crystal oscillator. While the specification describes several example embodiments of the disclosure considered favorable modes of practicing the disclosure, it should be understood that the disclosure can be implemented in many ways and is not limited to the particular examples described below or to the particular manner in which any features of such examples are implemented. In other instances, well-known details are not shown or described to avoid obscuring aspects of the disclosure.

Persons of ordinary skill in the art understand terms and basic concepts related to microelectronics that are used in this disclosure, such as "CMOS (complementary metal oxide semiconductor)," "PMOS (P-channel metal oxide semiconductor) transistor," "NMOS (N-channel metal oxide semiconductor) transistor," "node," "ground," "voltage," "frequency," "phase," "resonant tank," "crystal," and "inverter." Terms and basic concepts like these are well known and understood to those of ordinary skill in the art and thus will not be explained in detail here.

Those of ordinary skill in the art can recognize symbols of capacitor, resistor, diode, ground, and can recognize a MOS (metal-oxide semiconductor) transistor symbol, for both PMOS transistors and NMOS transistors, and identify the "source," the "gate," and the "drain" terminals thereof. Those of ordinary skills in the art can read schematics of a circuit comprising capacitors, resistors, diodes, NMOS transistors, and PMOS transistors, and do not need a verbose description about how one circuit element connects with another in the schematics. Those of ordinary skills in the art also understand units such as MHz (mega-Hertz), micron (μm), nanometer (nm), and pico-Farad (pF).

This disclosure is disclosed in an engineering sense. For instance, "A is equal to B" means "a difference between A and B is smaller than an engineering tolerance."

Throughout this disclosure, "$V_{DD}$" denotes a power supply node.

Figure 2:
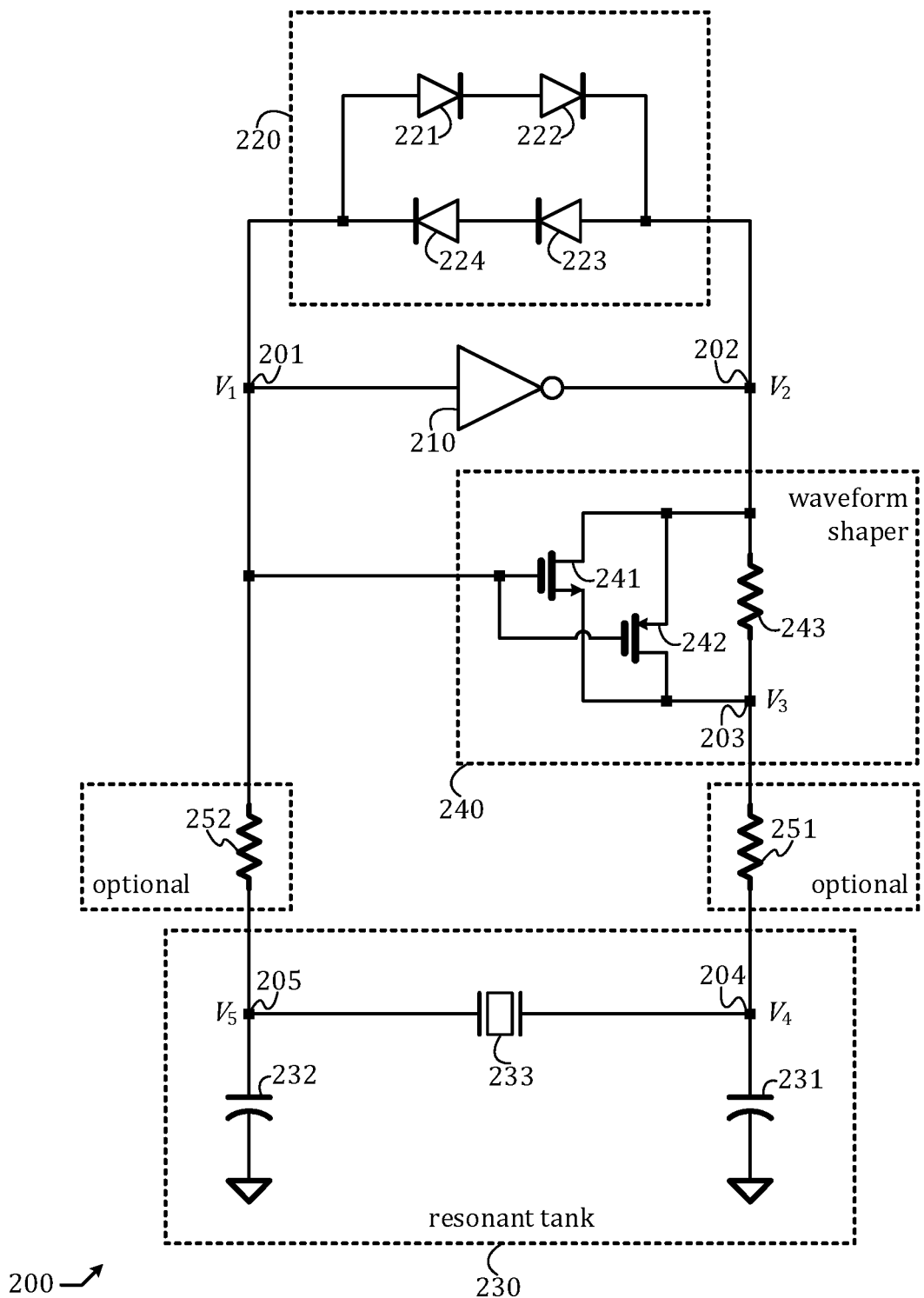
FIG. 2 shows a schematic diagram of a crystal oscillator in accordance with an embodiment of the present disclosure.

A schematic diagram of a crystal oscillator 200 in accordance an embodiment of the present disclosure is shown in FIG. 2. Crystal oscillator 200 comprises: an inverter 210 configured to receive a first voltage $V_1$ at a first node 201 and output a second voltage $V_2$ at a second node 202; a feedback network 220 inserted between the first node 201 and the second node 202, wherein the feedback network 220 comprises a parallel connection of a first branch and a second branch, the first branch comprising a first diode 221 and a second diode 222 stacked in a forward direction, the second branch comprising a third diode 223 and a fourth diode 224 stacked in a reverse direction; a waveform shaper 240 configured to receive the second voltage $V_2$ at a second node 202 and output a third voltage $V_3$ at a third node 203; a first optional resistor 251 inserted between the third node 203 and a fourth node 204; a second optional resistor 252 inserted between a fifth node 205 and the first node 201; and a resonant tank 230 comprising a crystal 233 inserted between the fourth node 204 and the fifth node 205, a first shunt capacitor 231 configured to shunt a fourth voltage $V_4$ at the fourth node 204 to ground, and a second shunt capacitor 232 configured to shunt a fifth voltage $V_5$ at the fifth node 205 to ground. The first (second) optional resistor 251 (252) is said to be optional, because it can be of zero-Ohm resistance and becomes a short circuit at the discretion of a circuit designer. Inverter 210 is configured to provide a gain needed to sustain an oscillation. Resonant tank 230 is configured to determine an oscillation frequency, at which the resonant tank 230 provides an approximately 180-degree phase shift that is needed to satisfy an oscillation condition. An output of the oscillation can be tapped from either $V_1$ at the first node 201 or $V_2$ at the second node 202. The first optional resistor 251 can be used to reduce a driving level of the crystal 233 to avoid a large oscillation signal damaging the crystal 233. The second optional resistor 252 is used to protect the inverter 210 in case of an electrostatic discharge event.

Figure 1:
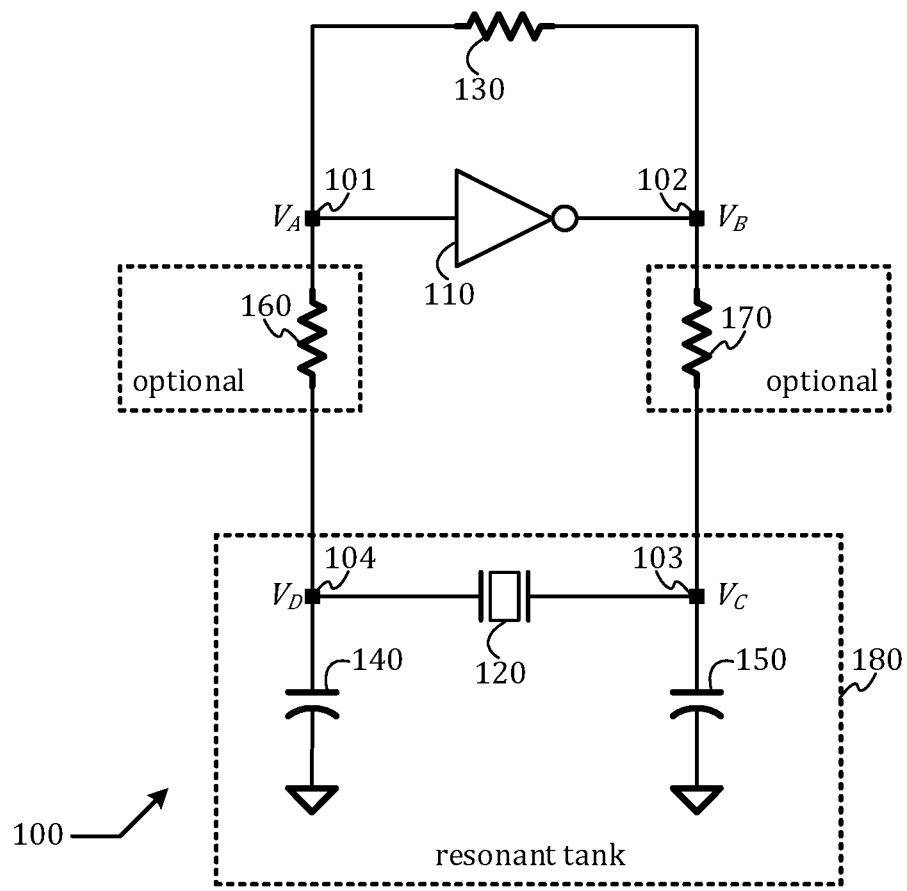
FIG. 1 shows a schematic diagram of a prior art crystal oscillator.

In an embodiment, the four diodes 221, 222, 223, and 224 are instantiated from the same diode device that has a threshold voltage $V_{th}$, wherein the diode device is turned off when a voltage across the diode device is below the threshold voltage $V_{th}$ and is turned on when the voltage across the diode device is above the threshold voltage $V_{th}$. Let a trip point of inverter 210 be $V_M$. (The concept of "trip point" is well understood by those of ordinary skills in the art and thus not explained in detail here). Diodes 221 and 222 are turned on when $V_1-V_2$ is above $2V_{th}$ (the factor of two is due to the stack-up of two diodes) and turned off otherwise. Diodes 223 and 224 are turned on when $V_1-V_2$ is below $-2V_{th}$ (the factor of two is due to the stack-up of two diodes) and turned off otherwise. Therefore, the feedback network 220 is turned on and conducting current and thus contributing noise only when $|V_1-V_2|$ exceeds twice the threshold voltage $V_{th}$. However, crystal oscillator 200 is most susceptible to noise when the oscillation output is small, i.e. $|V_1-V_M|$ is small, and incidentally $|V_2-V_M|$ and $|V_1-V_2|$ are also small, but when that occurs the feedback network 220 is turned off. Therefore, the feedback network 220 contributes almost no noise when the crystal oscillator 200 is most susceptible to noise and contributes noise only when $|V_1-V_2|$ is large and the crystal oscillator 200 is relatively immune to noise. This way, crystal oscillator 200 can have a better performance than the prior art crystal oscillator 100 of FIG. 1.

There is an issue, however, caused by the feedback network 220: the second voltage $V_2$ encounters an abrupt hindrance when $V_1-V_2$ rises above $2V_{th}$ or falls below $-2V_{th}$, due to a sudden turn-on of the feedback network 220, and this causes a slight kink in a waveform of the second voltage $V_2$. To alleviate this issue, the waveform shaper 240 is introduced. Waveform shaper 240 comprises a parallel connection of a coupling resistor 243, an NMOS transistor 241 controlled by the first voltage $V_1$, and a PMOS transistor 242 also controlled by the first voltage $V_1$. When $|V_1-V_M|$ is small, $|V_2-V_M|$ is also small, NMOS transistor 241 and PMOS transistor 242 are turned off, an overall resistance of the waveform shaper 240 is equal to a resistance of the coupling resistor 243. When $V_1$ is higher (lower) than $V_M$ by a certain amount, NMOS transistor 241 (PMOS transistor 242) is turned on, causing the overall resistance of the waveform shaper 240 to be smaller than the resistance of the coupling resistor 243. As a result, the waveform shaper 240 has a higher overall resistance that causes the third voltage $V_3$ to have a larger delay from the second voltage $V_2$ when $|V_1-V_M|$ is small, and has a lower overall resistance that causes the third voltage $V_3$ to have a smaller delay from the second voltage $V_2$ when $|V_1-V_M|$ is large. This causes the third voltage $V_3$ to have a moderate small-to-large signal transition and thus alleviate the issue of the slight kink in the waveform of the second voltage $V_2$. This way, high-frequency harmonics are suppressed in the third voltage $V_3$, and an undesired emission is alleviated.

In an alternative embodiment not shown in figure, the gate of NMOS transistor 241 is connected to "$V_{DD}$" (a power supply node) instead of to the first node 201, and the gate of PMOS transistor 242 is connected to ground instead of to the first node 201. This alternative embodiment still works but is not as effective in alleviating the undesired emission, as an overall resistance of the waveform shaper does not adjust effectively in accordance with the oscillation signal.

Figure 3:
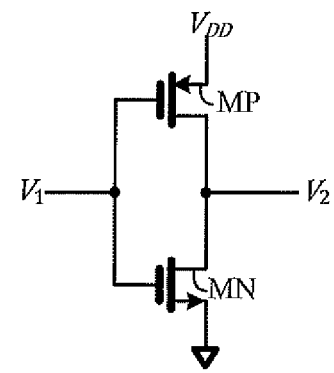
FIG. 3 shows a schematic diagram of an inverter.

A schematic diagram of inverter 210 in accordance with an embodiment of the present disclosure is shown in FIG. 3. Inverter 210 comprises an NMOS transistor MN and a PMOS transistor MP. Inverter 210 is well understood by those of ordinary skills in the art and thus not described in detail here.

By way of example but not limitation: $V_{DD}$ is 1.05V; width and length of NMOS transistor MN are 400 μm and 600 nm, respectively; width and length of PMOS transistor MP are 540 μm and 600 nm, respectively; the coupling resistor 243 is 200 Ohm; width and length of NMOS transistor 241 are 120 μm and 30 nm, respectively; width and length of PMOS transistor 242 are 120 μm and 30 nm, respectively; crystal 233 has a resonant frequency of 40 MHz; the first shunt capacitor 231 and the second shunt capacitor 232 are both 15 pF; the first optional resistor 251 is 40 Ohm; the second optional resistor 252 is 40 Ohm; the four diodes 221, 222, 223, and 224 are all embodied by a PMOS transistor configured in a diode-connected topology, wherein the width and length of the PMOS transistor are 1600 μm and 60 nm, respectively. A MOS (metal oxide semiconductor) transistor, either an NMOS transistor or a PMOS transistor, is said to be configured in a diode-connected topology if a gate terminal and a drain terminal of the MOS transistor are directly tied together. The description of "a MOS transistor configured in a diode-connected topology can be used to embody a diode" is well understood to those of ordinary skill in the art and thus not described in detail here. In an alternative embodiment, the four diodes 221, 222, 223, and 224 are all embodied by an NMOS transistor configured in a diode-connected topology.

Figure 4:
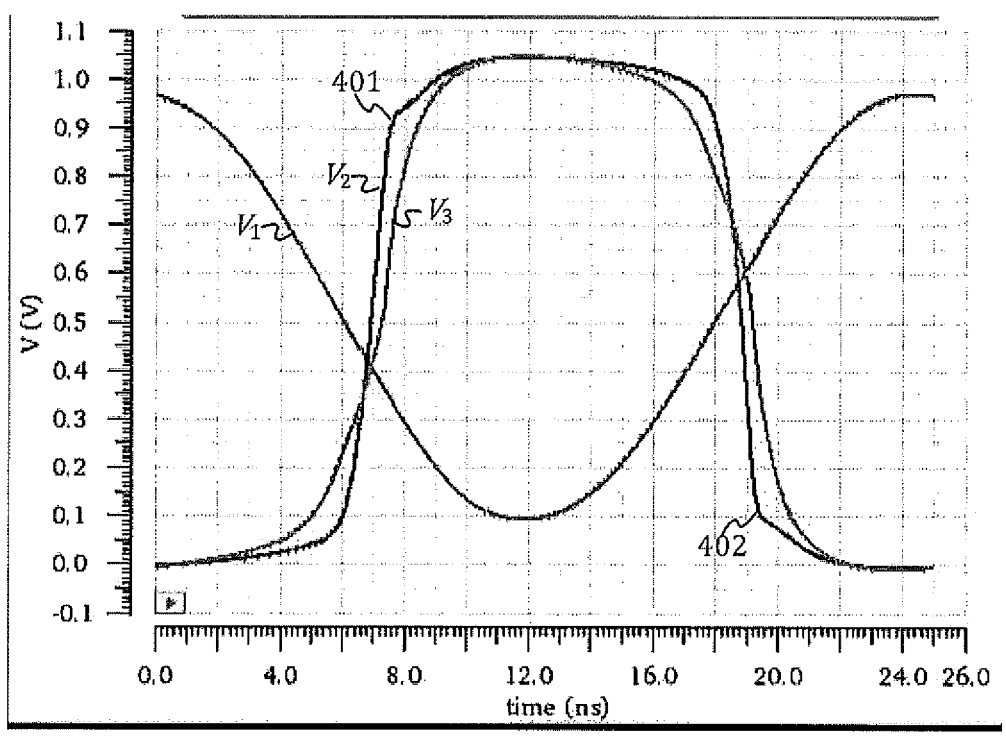
FIG. 4 shows a simulation waveform of the crystal oscillator of FIG. 2.

A simulation waveform of $V_1$, $V_2$, and $V_3$ over one oscillation cycle is shown in FIG. 4. As shown, there is a first kink 401 in $V_2$ when $V_1-V_2$ falls below $-2V_{th}$ (here, $V_{th}$ is approximately 260 mV), and a second kink 402 when $V_1-V_2$ rises above $2V_{th}$. Thanks to the waveform shaper 240, there are no kinks in the waveform of $V_3$, and high-frequency harmonics are suppressed. This way, the emission issue is addressed.

Figure 5:
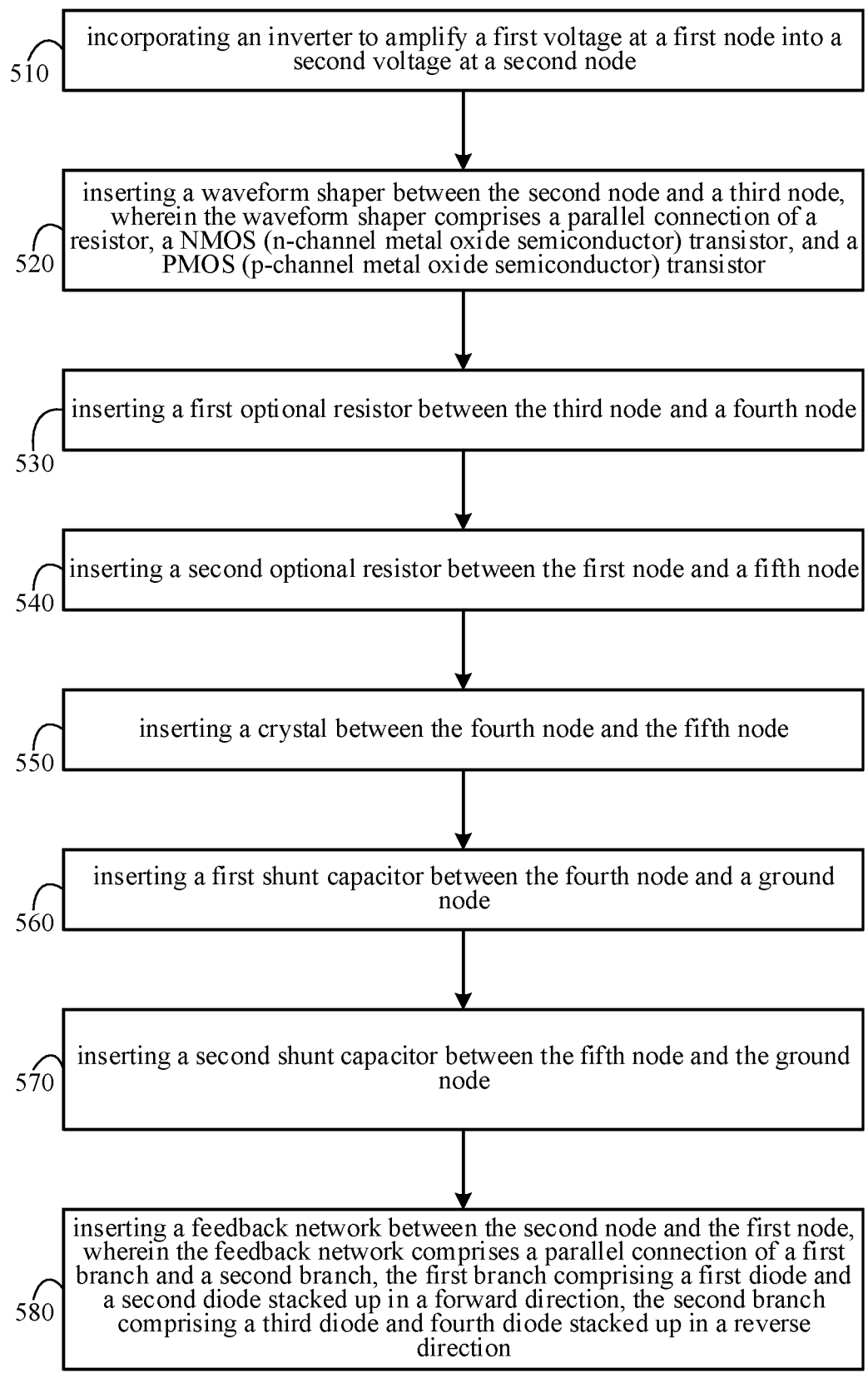
FIG. 5 shows a flow diagram of a method in accordance with the present disclosure.

As shown in a flow diagram 500 depicted in FIG. 5, a method comprises: (step 510) incorporating an inverter to amplify a first voltage at a first node into a second voltage at a second node; (step 520) inserting a waveform shaper between the second node and a third node, wherein the waveform shaper comprises a parallel connection of a resistor, an NMOS (n-channel metal oxide semiconductor) transistor, and a PMOS (p-channel metal oxide semiconductor) transistor; (step 530) inserting a first optional resistor between the third node and a fourth node; (step 540) inserting a second optional resistor between the first node and a fifth node; (step 550) inserting a crystal between the fourth node and the fifth node; (step 560) inserting a first shunt capacitor between the fourth node and a ground node; (step 570) inserting a second shunt capacitor between the fifth node and the ground node; and (step 580) inserting a feedback network between the second node and the first node, wherein the feedback network comprises a parallel connection of a first branch and a second branch, the first branch comprising a first diode and a second diode stacked in a forward direction, the second branch comprising a third diode and fourth diode stacked in a reverse direction.

Those skilled in the art will readily observe that numerous modifications and alterations of the device and method may be made while retaining the teachings of the disclosure. Accordingly, the above disclosure should not be construed as limited only by the metes and bounds of the appended claims.

What is claimed is:

1. A crystal oscillator comprising:
    an inverter configured to receive a first voltage at a first node and output a second voltage at a second node; a feedback network inserted between the first node and the second node, the feedback network comprising a parallel connection of a first branch and a second branch, the first branch comprising a first diode and a second diode stacked up in a forward direction, the second branch comprising a third diode and a fourth diode stacked up in a reverse direction;
    a waveform shaper configured to couple the second node to a third node in accordance with the first voltage, the waveform shaper comprising a parallel connection of a coupling resistor, an NMOS (n-channel metal oxide semiconductor) transistor, and a PMOS (p-channel metal oxide semiconductor) transistor;
    a crystal inserted between a fourth node and a fifth node, wherein the fourth node is coupled to the third node, and the fifth node is coupled to the first node;
    a first shunt capacitor inserted between the fourth node and a ground node; and
    a second shunt capacitor inserted between the fifth node to and the ground node.

2. The crystal oscillator of claim 1, wherein the crystal oscillator further comprises: a first optional resistor inserted between the third node and the fourth node; a second optional resistor inserted between the fifth node and the first node.

3. The crystal oscillator of claim 1, wherein each of the first diode, the second diode, the third diode, and the fourth diode is embodied by a MOS (metal oxide semiconductor) transistor configured in a diode-connected topology.

4. The crystal oscillator of claim 1, wherein each of the first diode, the second diode, the third diode, and the fourth diode is embodied by a PMOS transistor configured in a diode-connected topology.

5. The crystal oscillator of claim 1, wherein each of the first diode, the second diode, the third diode, and the fourth diode is embodied by an NMOS transistor configured in a diode-connected topology.

6. The crystal oscillator of claim 1, wherein the NMOS transistor and the PMOS transistor are controlled by the first voltage.

7. A method comprising:
    incorporating an inverter to amplify a first voltage at a first node into a second voltage at a second node;
    inserting a waveform shaper between the second node and a third node, wherein the waveform shaper comprises a parallel connection of a resistor, an NMOS (n-channel metal oxide semiconductor) transistor, and a PMOS (p-channel metal oxide semiconductor) transistor;
    inserting a crystal between a fourth node and a fifth node, wherein the fourth node is coupled to the third node, and the fifth node is coupled to the first node;
    inserting a first shunt capacitor between the fourth node and a ground node;
    inserting a second shunt capacitor between the fifth node and the ground node; and
    inserting a feedback network between the second node and the first node, wherein the feedback network comprises a parallel connection of a first branch and a second branch, the first branch comprising a first diode and a second diode stacked in a forward direction, the second branch comprising a third diode and fourth diode stacked in a reverse direction.

8. The method of claim 7, wherein the method further comprises: inserting a first optional resistor between the third node and the fourth node; inserting a second optional resistor between the first node and the fifth node.

9. The method of claim 7, wherein each of the first diode, the second diode, the third diode, and the fourth diode is embodied by a MOS (metal oxide semiconductor) transistor configured in a diode-connected topology.

10. The method of claim 7, wherein each of the first diode, the second diode, the third diode, and the fourth diode is embodied by a PMOS transistor configured in a diode-connected topology.

11. The method of claim 7, wherein each of the first diode, the second diode, the third diode, and the fourth diode is embodied by an NMOS transistor configured in a diode-connected topology.

12. The method of claim 7, wherein the NMOS transistor and the PMOS transistor are controlled by the first voltage.

* * * * *